(12) United States Patent
Lu et al.

(10) Patent No.: US 11,942,294 B2
(45) Date of Patent: Mar. 26, 2024

(54) HIGH-SAFETY LAMP TUBE AND METHOD FOR INCREASING PROTECTION RANGE OF THERMAL FUSE

(71) Applicant: Xiamen PVTECH Co., Ltd., Fujian (CN)

(72) Inventors: Fuxing Lu, Fujian (CN); Rongtu Liu, Fujian (CN)

(73) Assignee: Xiamen PVTECH Co., Ltd., Fujian (CN)

( * ) Notice: Subject to any disclaimer, the term of this patent is extended or adjusted under 35 U.S.C. 154(b) by 229 days.

(21) Appl. No.: 17/571,520

(22) Filed: Jan. 9, 2022

(65) Prior Publication Data
US 2023/0170170 A1 Jun. 1, 2023

(30) Foreign Application Priority Data

Nov. 29, 2021 (CN) .......................... 202111435720.7

(51) Int. Cl.
| | |
|---|---|
| *H01H 37/76* | (2006.01) |
| *F21V 25/10* | (2006.01) |
| *H01H 37/04* | (2006.01) |
| *H01H 37/34* | (2006.01) |
| *H05K 1/02* | (2006.01) |
| *H05K 3/28* | (2006.01) |

(52) U.S. Cl.
CPC ......... *H01H 37/761* (2013.01); *H05K 1/0201* (2013.01); *H05K 2201/10181* (2013.01)

(58) Field of Classification Search
CPC .... H01H 37/761; H05K 1/0201; H05K 1/185; H05K 3/284; H05K 2201/1018; F21V 25/10; F21V 25/04; F21Y 2103/00
See application file for complete search history.

(56) References Cited

U.S. PATENT DOCUMENTS

| | | | |
|---|---|---|---|
| 8,444,292 B2 * | 5/2013 | Ivey ...................... | F21V 31/005 362/225 |
| 10,088,142 B1 * | 10/2018 | McGrath ............... | F21V 15/015 |
| 11,545,448 B2 * | 1/2023 | Kertesz ............... | H01L 23/5386 |
| 2013/0119896 A1 * | 5/2013 | Fukano .................... | H01J 5/50 313/46 |
| 2015/0091471 A1 * | 4/2015 | Shan ....................... | H05B 47/17 315/294 |
| 2016/0234909 A1 * | 8/2016 | Park ......................... | F21V 23/06 |
| 2017/0003013 A1 * | 1/2017 | Xu ........................... | F21V 29/70 |
| 2018/0063906 A1 * | 3/2018 | Tao ......................... | H05B 45/39 |
| 2020/0208791 A1 * | 7/2020 | Jiang ..................... | F21V 23/006 |

* cited by examiner

*Primary Examiner* — Hoa C Nguyen
*Assistant Examiner* — Amol H Patel
(74) *Attorney, Agent, or Firm* — Winston Hsu

(57) ABSTRACT

A method for increasing the protection range of a thermal fuse, which includes the following steps: disposing the thermal fuse on a circuit board including a circuit loop, a first heat generating element and a second heat generating element; the second heat generating element is electrically connected to the circuit loop; electrically connecting the first heat generating element to the circuit loop; and disposing the heat conducting material on the circuit loop and making the heat conducting material cover the thermal fuse, the first heat generating element and the second heat generating element.

8 Claims, 8 Drawing Sheets

HIGH-SAFETY LAMP TUBE AND METHOD FOR INCREASING PROTECTION RANGE OF THERMAL FUSE

BACKGROUND OF THE INVENTION

1. Field of the Invention

The present invention relates to a lamp tube, in particular to a high-safety lamp tube. The present invention further relates to a method for increasing the protection range of a thermal fuse.

2. Description of the Prior Art

The circuit board of a currently available lamp tube is usually provided with a thermal fuse. However, if a poor contact between the contact points of the lamp holder and the copper pins of the lamp tube occurs, the copper pins may be overheated. In this case, the thermal fuse can be blown in order to protect the circuit. In addition, thermal runaway may happen in some electronic components of the circuit board of the lamp tube due to various factors. However, the lamp tube usually has no more than one thermal fuse, so cannot provide any protection mechanism for the above situation.

SUMMARY OF THE INVENTION

The present invention is related to a high-safety lamp tube. In one embodiment of the present invention, the high-safety lamp tube includes a main body, a circuit board, a thermal fuse and a heat conducting material. The circuit board is disposed in the main body, and includes a circuit loop, a first heat generating element, a second heat generating element. The second heat generating element is electrically connected to the circuit loop. The first heat generating element is electrically connected to the circuit loop via the thermal fuse. The heat conducting material is disposed on the circuit board. The heat conducting material covers the thermal fuse, the first heat generating element and the second heat generating element.

In one embodiment, the heat conducting material is a thermal grease, a thermal gel, a thermal clay, etc.

In one embodiment, the first heat generating element and the second heat generating element are varistors, coils, transformers, cooper pins or control chips.

In one embodiment, the thermal fuse is adhered to the first heat generating element via an adhesive layer.

In one embodiment, the circuit board is a driving power source circuit board.

The present invention is related to a method for increasing the protection range of a thermal fuse. In one embodiment of the present invention, the method includes the following steps: disposing the thermal fuse on a circuit board comprising a circuit loop, a first heat generating element and a second heat generating element, wherein the second heat generating element is electrically connected to the circuit loop; electrically connecting the first heat generating element to the circuit loop via the thermal fuse; and disposing a heat conducting material on the circuit board, and making the heat conducting material cover the thermal fuse, the first heat generating element and the second heat generating element.

In one embodiment, the method for increasing the protection range of the thermal fuse further includes the following step: pressing the heat conducting material to make the thickness of the heat conducting material to be uniform.

In one embodiment, the method for increasing the protection range of the thermal fuse further includes the following step: adhering the thermal fuse to the first heat generating element via an adhesive layer.

In one embodiment, the first heat generating element and the second heat generating element are varistors, coils, transformers, cooper pins or control chips.

In one embodiment, the circuit board is a driving power source circuit board.

The high-safety lamp tube and the method for increasing the protection range of the thermal fuse in accordance with the embodiments of the present invention may have the following advantages:

(1) In one embodiment of the present invention, the method for increasing the protection range of the thermal fuse can cover a plurality of heat generating elements and a thermal fuse by a heat conducting material. Thus, the protection range of the thermal fuse can be increased from two points to an area in order to avoid an accident occurs because these heat generating elements are overheated. Accordingly, the safety of the lamp tube can be effectively enhanced.

(2) In one embodiment of the present invention, the method for increasing the protection range of the thermal fuse can adjust the covering area of the heat conducting material, so the user can change the protection range according to actual requirements. Thus, the method can be more flexible in use.

(3) In one embodiment of the present invention, the method for increasing the protection range of the thermal fuse can not only be applicable to various types of lamp tubes, but also can be applicable to various electronic devices or household appliances. Thus, the method can be more comprehensive in application.

(4) In one embodiment of the present invention, the method for increasing the protection range of the thermal fuse can achieve the desired technical effects without significantly increasing the cost, so the method can not only conform to actual requirements, but also can have high practicality.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will become more fully understood from the detailed description given herein below and the accompanying drawings which are given by way of illustration only, and thus are not limitative of the present invention and wherein.

DETAILED DESCRIPTION

Figure 1:
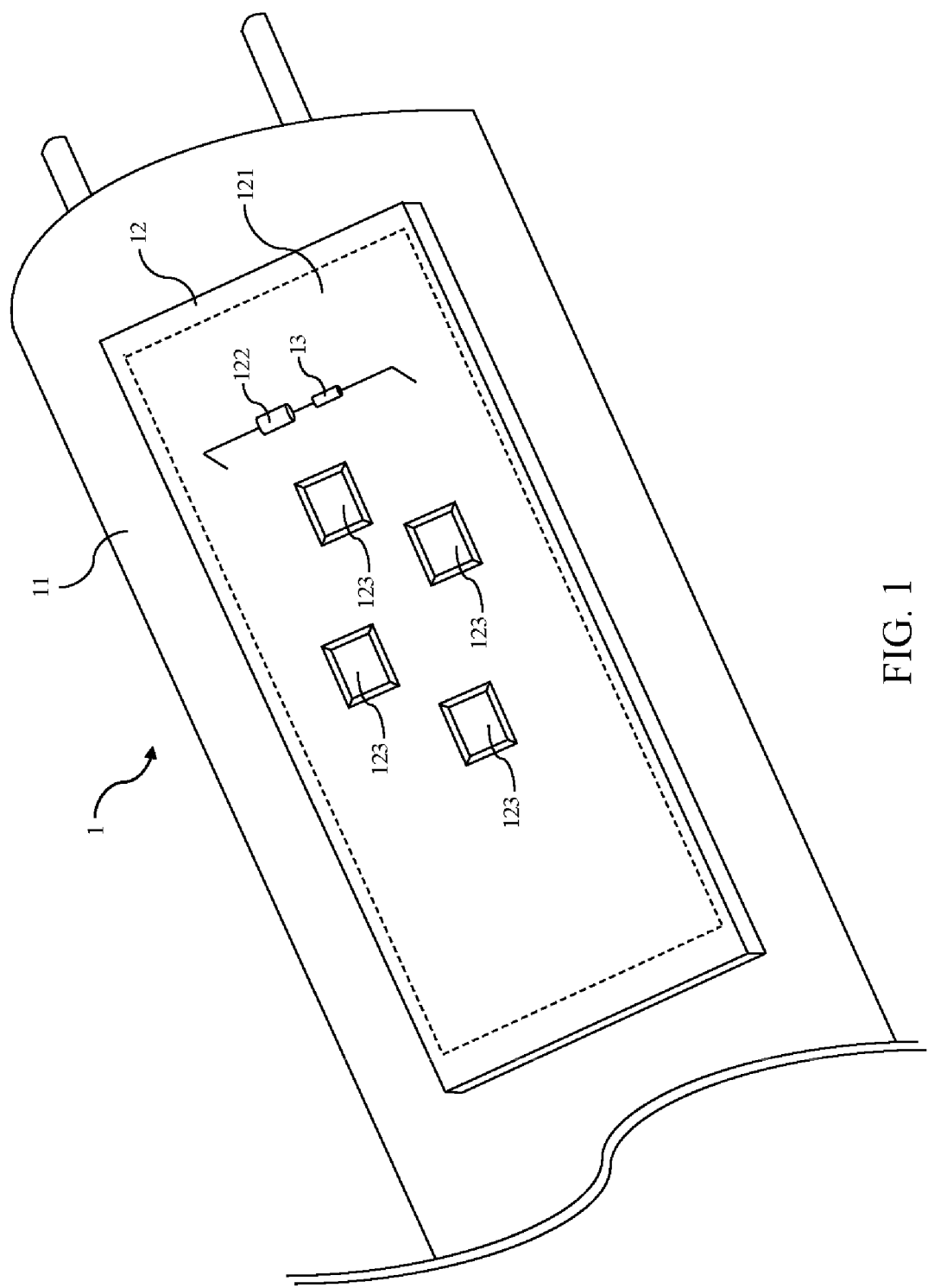
FIG. 1 is a first perspective view of a high-safety lamp tube in accordance with a first embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It should be understood that, when it is described that an element is "coupled" or "connected" to another element, the element may be "directly coupled" or "directly connected" to the other element or "coupled" or "connected" to the other element through a third element. In contrast, it should be understood that, when it is described that an element is "directly coupled" or "directly connected" to another element, there are no intervening elements.

Figure 2:
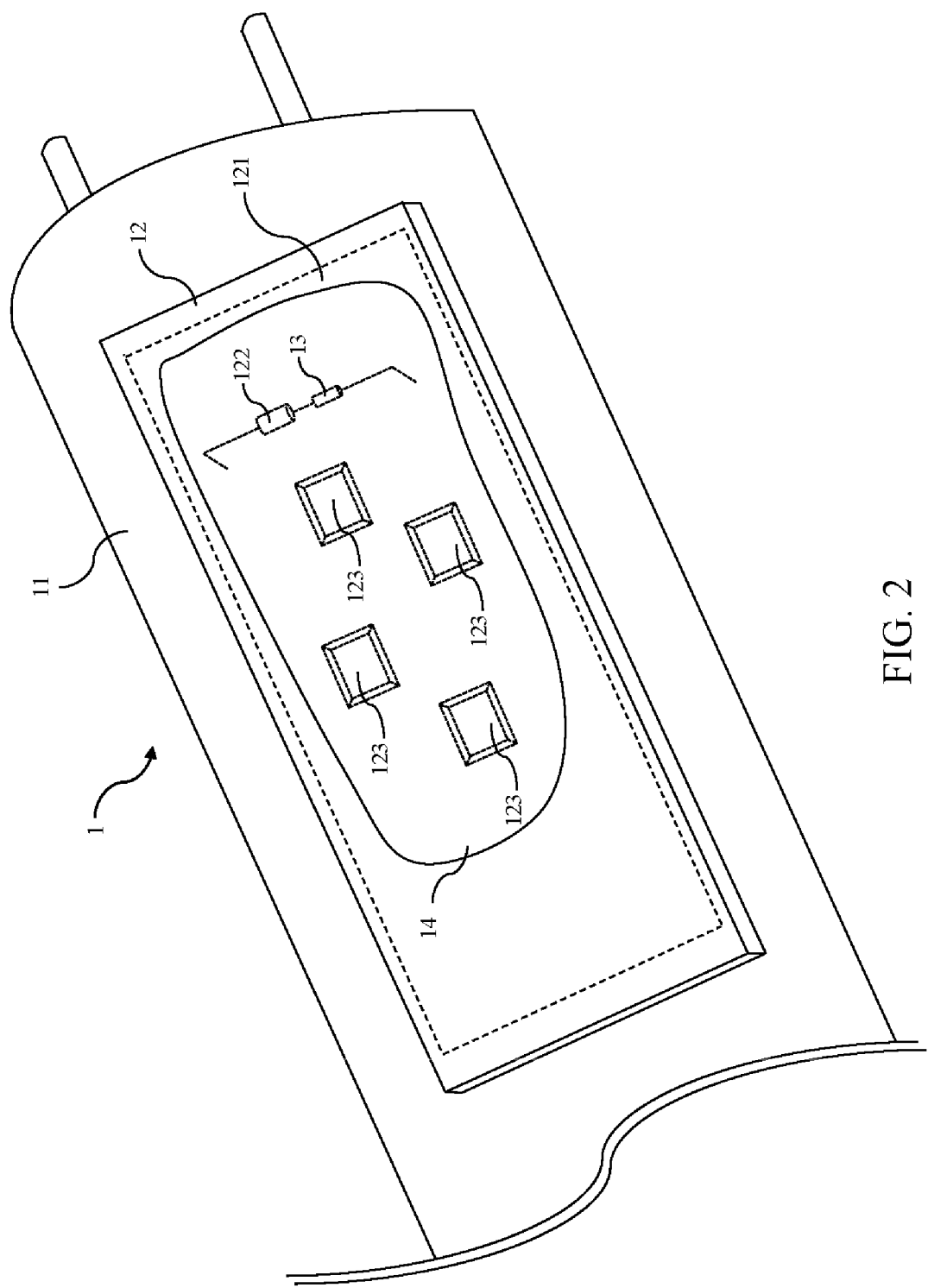
FIG. 2 is a second perspective view of the high-safety lamp tube in accordance with the first embodiment of the present invention.
Figure 3:
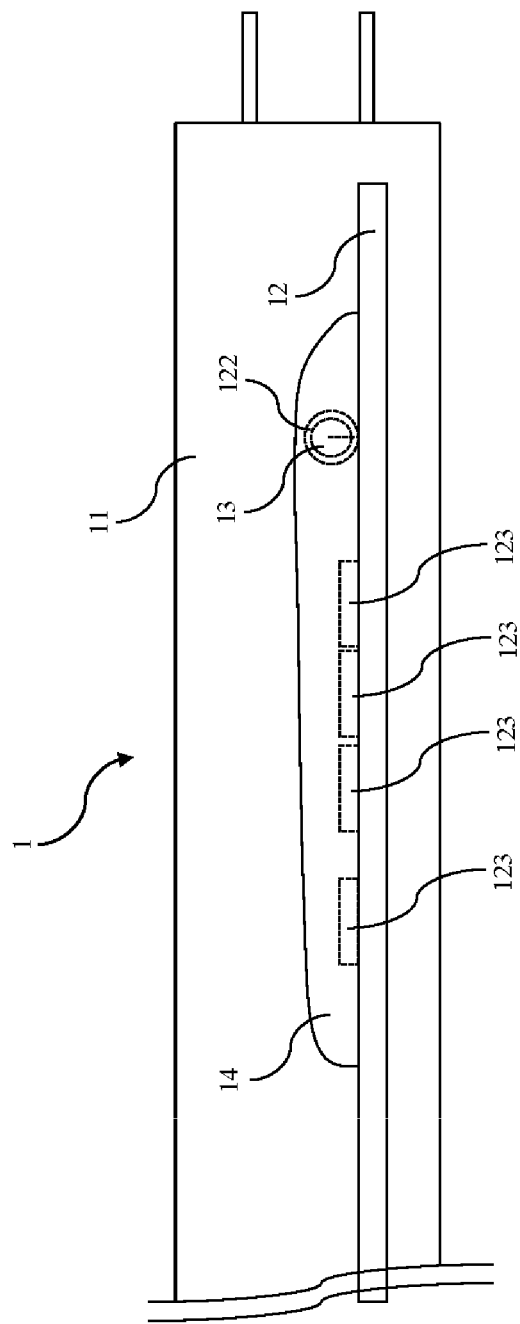
FIG. 3 is a cross-sectional view of the high-safety lamp tube in accordance with the first embodiment of the present invention.

Please refer to FIG. 1, FIG. 2 and FIG. 3. FIG. 1 is a first perspective view (without the heat conducting material) of a high-safety lamp tube in accordance with a first embodiment of the present invention. FIG. 2 is a second perspective view (with the heat conducting material) of the high-safety lamp tube in accordance with the first embodiment of the present invention. FIG. 3 is a cross-sectional view of the high-safety lamp tube in accordance with the first embodiment of the present invention. As shown in FIG. 1, the high-safety lamp tube 1 includes a main body 11, a circuit board 12, a thermal fuse 13 and a heat conducting material 14.

The circuit board 12 is disposed in the main body 11. The circuit board 12 includes a circuit loop 121, a first heat generating element 122 and a plurality of second heat generating elements 123 (there may be one or more second heat generating elements 123; the quantity of the second heat generating elements 123 shown in the drawings is just for example instead of limitation). The first heat generating element 122 is electrically connected to the circuit loop 121 via the thermal fuse 13. In one embodiment, the first heat generating element 122 may be, but not limited to, a varistor, a coil, a transformer, a cooper pin, a control chip or other similar components. In one embodiment, the second heat generating elements 123 may be, but not limited to, varistors, coils, transformers, cooper pins, control chips or other similar components. The aforementioned control chip may be, but not limited to, a central processing unit (CPU), a microcontroller (CMU), an application specific integrated circuit (ASIC) or other slimier components. In one embodiment, the circuit board 12 may be, but not limited to, a driving power source circuit board for a lamp tube. In another embodiment, the circuit board 12 may also be a circuit board for various electronic devices or household appliances.

The first heat generating element 122 is electrically connected to the circuit loop 121 via the thermal fuse 13. In this embodiment, the thermal fuse 13 is connected to the circuit loop 121 in series. When the thermal fuse 13 has blown, the circuit loop 121 can be electrically disconnected from the heat generating element 122.

As shown in FIG. 2 and FIG. 3, the heat conducting material 14 is disposed on the circuit board 12 and covers the thermal fuse 13, the first heat generating element 122 and the second heat generating elements 123. In one embodiment, the heat conducting material 14 is a thermal grease, a thermal gel, a thermal clay or other similar materials.

When the temperature of the first heat generating element 122 increases, the thermal energy generated thereby can be directly conducted to the thermal fuse 13. When the temperature of the thermal fuse 13 increases to a predetermined temperature, the thermal fuse is blown in order to electrically disconnect the first heat generating element 122 from the circuit loop 121 in order to protect the circuit board 12.

When the temperatures of the second heat generating elements 123 increase, the thermal energies generated thereby can be conducted to the thermal fuse 13 via the heat conducting material 14. When the temperature of the thermal fuse 13 increases to the predetermined temperature, the thermal fuse 13 is blown so as to electrically disconnected the above elements from the circuit loop 121 with a view to protect the circuit board 12.

Via the above structure, the heat conducting material 14 can simultaneously cover the first heat generating element 122, the second heat generating elements 123 and a part of the circuit loop 121. As a result, the protection range of the thermal fuse 13 can be effectively increased. According to this embodiment, the thermal fuse 13 can protect multiple heat generating elements without increasing the quantity of the thermal fuse 13. In this way, the protection range of the thermal fuse 13 can be extended from two points to an area in order to prevent several heat generating elements from being overheated, so the protection range of the thermal fuse 13 can be effectively increased and the safety of the lamp tube 1 can be enhanced. In addition, the covering area of the heat conducting material 14 can be adjusted by the user so as to change the protection range of the thermal fuse 13 according to actual requirements. Thus, the thermal fuse 13 can be more flexible in use.

The embodiment just exemplifies the present invention and is not intended to limit the scope of the present invention; any equivalent modification and variation according to the spirit of the present invention is to be also included within the scope of the following claims and their equivalents.

It is worthy to point out that thermal runaway may happen in some electronic components of the circuit board of a currently available lamp tube due to various factors. However, the lamp tube usually has no more than one thermal fuse, so cannot provide any protection mechanism for the above situation. On the contrary, according to one embodiment of the present invention, the method for increasing the protection range of the thermal fuse can cover a plurality of heat generating elements and a thermal fuse by a heat conducting material. Thus, the protection range of the thermal fuse can be increased from two points to an area in order to avoid an accident occurs because these heat generating elements are overheated. Accordingly, the safety of the lamp tube can be effectively enhanced.

Besides, according to one embodiment of the present invention, the method for increasing the protection range of the thermal fuse can adjust the covering area of the heat conducting material, so the user can change the protection range according to actual requirements. Thus, the method can be more flexible in use.

Moreover, according to one embodiment of the present invention, the method for increasing the protection range of the thermal fuse can not only be applicable to various types of lamp tubes, but also can be applicable to various electronic devices or household appliances. Thus, the method can be more comprehensive in application.

Furthermore, according to one embodiment of the present invention, the method for increasing the protection range of the thermal fuse can achieve the desired technical effects without significantly increasing the cost, so the method can not only conform to actual requirements, but also can have high practicality. As described above, the high-safety lamp tube and the method for increasing the protection range of the thermal fuse can surely achieve great technical effects and conform to the requirements of actual applications.

Figure 4:
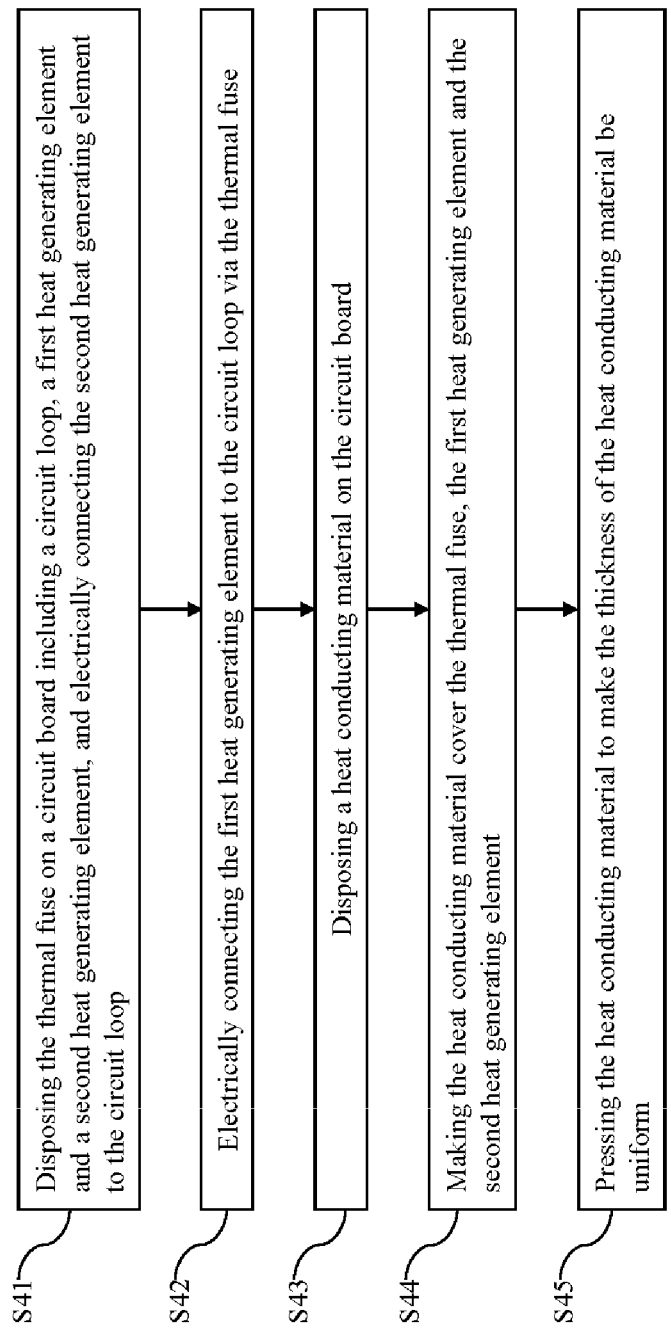
FIG. 4 is a flow chart of a method for increasing the protection range of a thermal fuse in accordance with the first embodiment of the present invention.

Please refer to FIG. 4, which is a flow chart of a method for increasing the protection range of a thermal fuse in accordance with the first embodiment of the present invention. As shown in FIG. 4, the method of this embodiment includes the following steps:

Step S41: disposing the thermal fuse on a circuit board including a circuit loop, a first heat generating element and a second heat generating element, and electrically connecting the second heat generating element to the circuit loop.

Step S42: electrically connecting the first heat generating element to the circuit loop via the thermal fuse.

Step S43: disposing a heat conducting material on the circuit board.

Step S44: making the heat conducting material cover the thermal fuse, the first heat generating element and the second heat generating element. In this step, the heat conducting material is spread over a part of the surface of the circuit board, such that the heat conducting material can cover the thermal fuse, the first heat generating element and the second heat generating elements.

Step S45: pressing the heat conducting material to make the thickness of the heat conducting material be uniform. In this step, the thickness of the heat conducting material can be more uniform by pressing the heat conducting material, such that the thermal energy can be swiftly and evenly conducted to the thermal fuse via the heat conducting material.

The embodiment just exemplifies the present invention and is not intended to limit the scope of the present invention; any equivalent modification and variation according to the spirit of the present invention is to be also included within the scope of the following claims and their equivalents.

Figure 5:
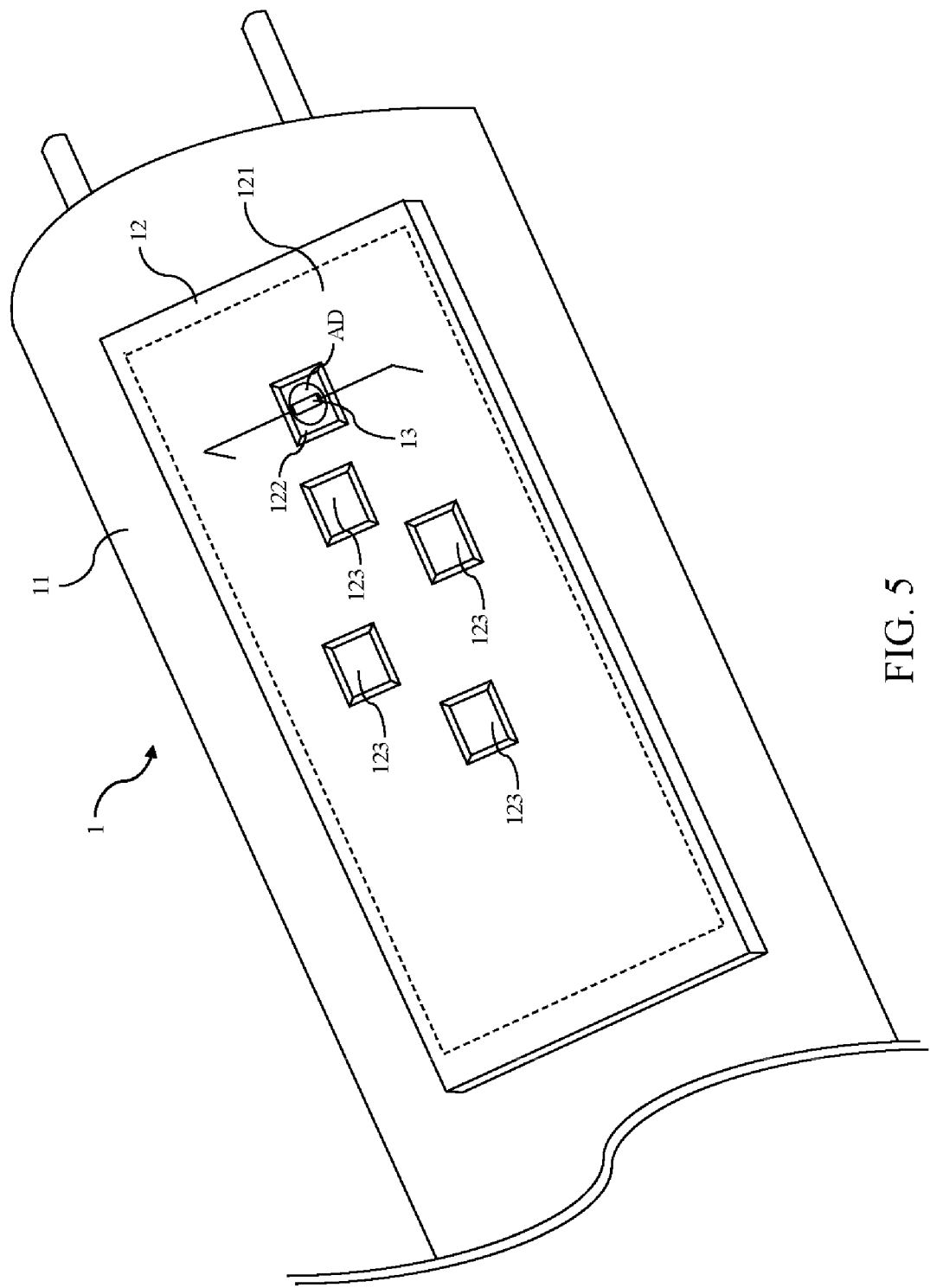
FIG. 5 is first perspective view of a high-safety lamp tube in accordance with a second embodiment of the present invention.
Figure 6:
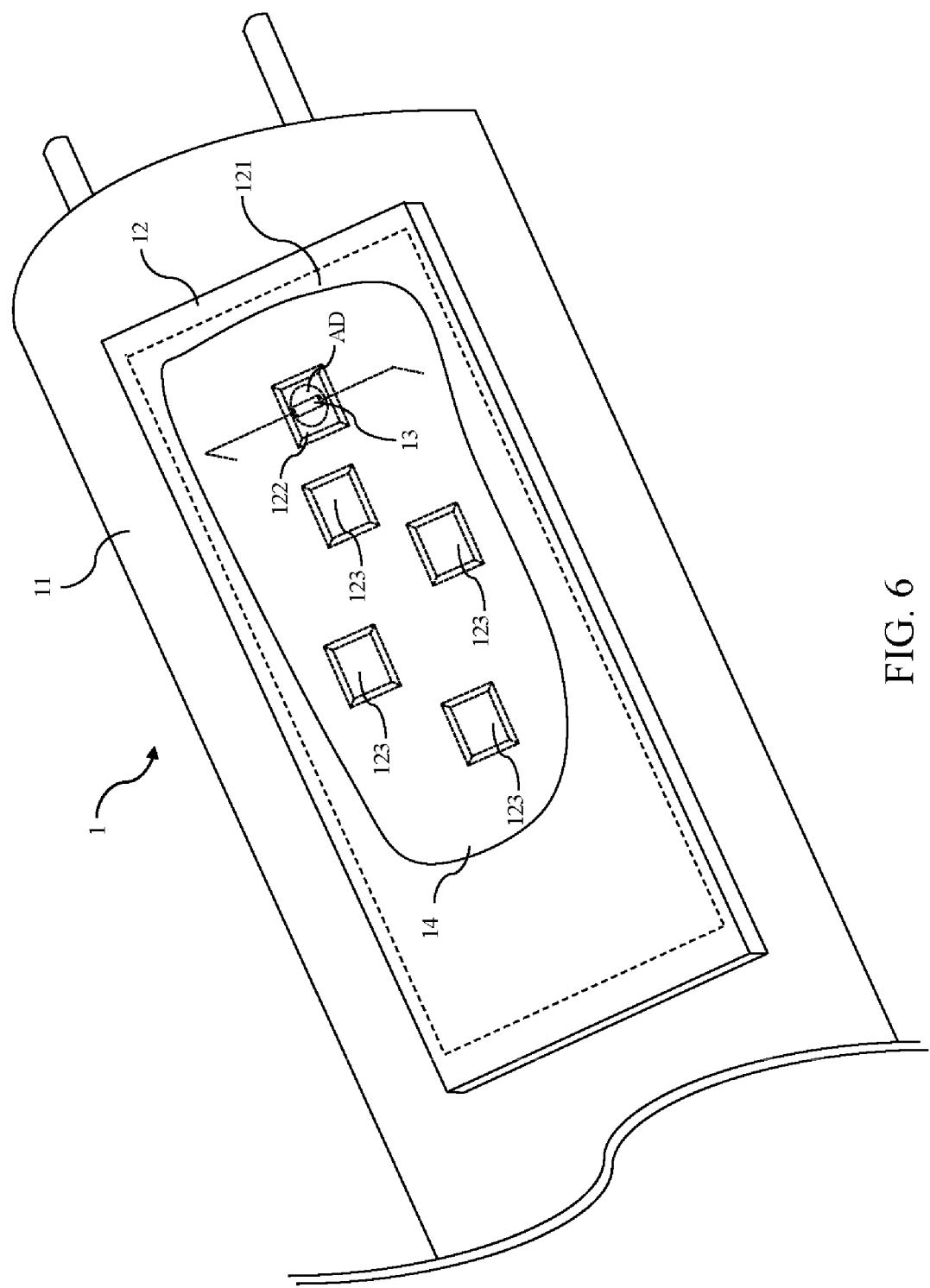
FIG. 6 is a second perspective view of the high-safety lamp tube in accordance with the second embodiment of the present invention.
Figure 7:
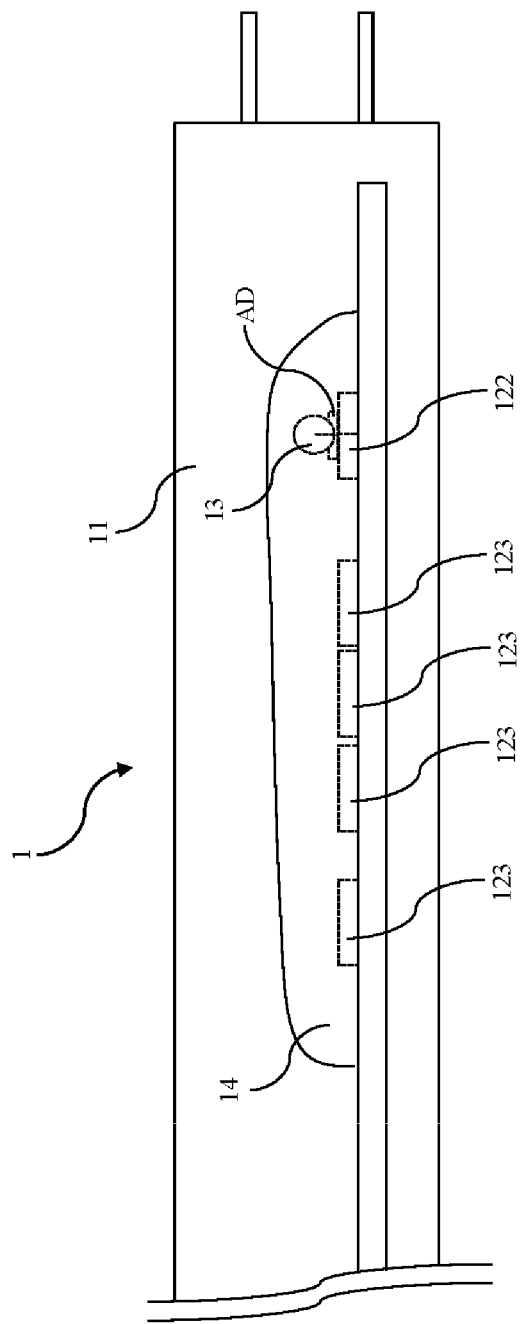
FIG. 7 is a cross-sectional view of the high-safety lamp tube in accordance with the second embodiment of the present invention.

Please refer to FIG. 5, FIG. 6 and FIG. 7. FIG. 5 is a first perspective view (without the heat conducting material) of a high-safety lamp tube in accordance with a second embodiment of the present invention. FIG. 6 is a second perspective view (with the heat conducting material) of the high-safety lamp tube in accordance with the second embodiment of the present invention. FIG. 7 is a cross-sectional view of the high-safety lamp tube in accordance with the second embodiment of the present invention. As shown in FIG. 5, the high-safety lamp tube 1 includes a main body 11, a circuit board 12, a thermal fuse 13 and a heat conducting material 14.

The circuit board 12 is disposed in the main body 11. The circuit board 12 includes a circuit loop 121, a first heat generating element 122 and a plurality of second heat generating elements 123 (there may be one or more second heat generating elements 123; the quantity of the second heat generating elements 123 shown in the drawings is just for example instead of limitation). The first heat generating element 122 is electrically connected to the circuit loop 121 via the thermal fuse 13 and the second heat generating elements 123 are electrically connected to the circuit loop 121.

The first heat generating element 122 is electrically connected to the circuit loop 121 via the thermal fuse 13. In this embodiment, the adhesive layer AD covers a part of the surface of the first heat generating element 122 and the thermal fuse 13 is adhered to the first heat generating element 122 via the adhesive layer AD. The contact area between the adhesive layer AD and the first heat generating element 122 is greater than the contact area between the thermal fuse 13 and the adhesive layer AD. In one embodiment, the adhesive layer AD may be, but not limited to, phenolic resins, urea-formaldehyde resins, polyvinyl acetate resins, polyethylene-vinyl acetate resins, polyacrylic resins, polyurethane, hot-melt adhesive, etc. When the thermal fuse 13 is blown, the circuit loop 121 can be electrically disconnected from the first heat generating element 122.

As shown in FIG. 6 and FIG. 7, the heat conducting material 14 is disposed on the circuit board 12 and covers the thermal fuse 13, the first heat generating element 122 and the second heat generating elements 123. The heat conducting material 14 contacts a part of the adhesive layer AD.

When the temperature of the first heat generating element 122 increases, the thermal energy generated thereby can be directly conducted to the thermal fuse 13 via the adhesive layer AD in a short time. When the temperature of the thermal fuse 13 increases to a predetermined temperature, the thermal fuse 13 is blown to electrically disconnect the first heat generating element 122 from the circuit loop 121 with a view to protect the circuit board 12.

When the temperatures of the second heat generating elements 123 increase, the thermal energies generated thereby can be conducted to the thermal fuse 13 via the heat conducting material 14. Besides, as the heat conducting material 14 contacts a part of the adhesive layer AD, the heat conducting speed can be effectively increased. When the temperature of the thermal fuse 13 increases to the predetermined temperature, the thermal fuse 13 is blown to electrically disconnect the above elements from the circuit loop 121 so as to protect the circuit board 12.

In this embodiment, the thermal fuse 13 is adhered to the first heat generating element 122 via the adhesive layer AD. Besides, the contact area between the adhesive layer AD and the first heat generating element 122 is greater than the contact area between the thermal fuse 13 and the adhesive layer AD. Accordingly, if the first heat generating element 122 tends to generate a large amount of thermal energy, the above structure can more effectively avoid that the circuit board 12 is damaged because the first heat generating element 122 is overheated. Further, the above structure can also effectively avoid that the second heat generating elements 123 are overheated.

The embodiment just exemplifies the present invention and is not intended to limit the scope of the present invention; any equivalent modification and variation according to the spirit of the present invention is to be also included within the scope of the following claims and their equivalents.

Figure 8:
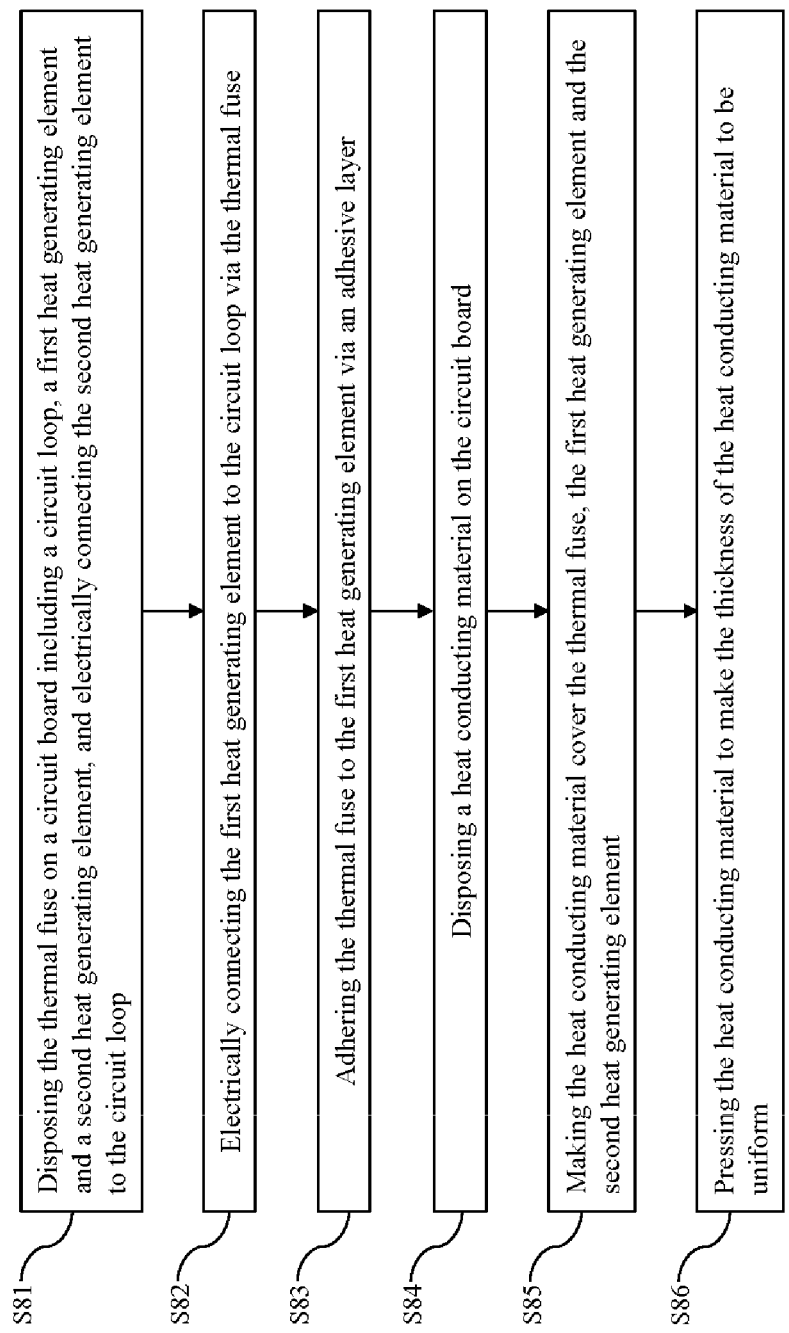
FIG. 8 is a flow chart of a method for increasing the protection range of a thermal second in accordance with the first embodiment of the present invention.

Please refer to FIG. 8, which is a flow chart of a method for increasing the protection range of a thermal fuse in accordance with the second embodiment of the present invention. As shown in FIG. 8, the method of this embodiment includes the following steps:

Step S81: disposing the thermal fuse on a circuit board including a circuit loop, a first heat generating element and a second heat generating element, and electrically connecting the second heat generating element to the circuit loop.

Step S82: electrically connecting the first heat generating element to the circuit loop via the thermal fuse.

Step S83: adhering the thermal fuse to the first heat generating element via an adhesive layer.

Step S84: disposing a heat conducting material on the circuit board.

Step S85: making the heat conducting material cover the thermal fuse, the first heat generating element and the second heat generating element.

Step S86: pressing the heat conducting material to make the thickness of the heat conducting material to be uniform.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

To sum up, according to one embodiment of the present invention, the method for increasing the protection range of the thermal fuse can cover a plurality of heat generating elements and a thermal fuse by a heat conducting material. Thus, the protection range of the thermal fuse can be increased from two points to an area in order to avoid an accident occurs because these heat generating elements are overheated. Accordingly, the safety of the lamp tube can be effectively enhanced.

Besides, according to one embodiment of the present invention, the method for increasing the protection range of the thermal fuse can adjust the covering area of the heat conducting material, so the user can change the protection range according to actual requirements. Thus, the method can be more flexible in use.

Moreover, according to one embodiment of the present invention, the method for increasing the protection range of the thermal fuse can not only be applicable to various types of lamp tubes, but also can be applicable to various electronic devices or household appliances. Thus, the method can be more comprehensive in application.

Furthermore, according to one embodiment of the present invention, the method for increasing the protection range of the thermal fuse can achieve the desired technical effects without significantly increasing the cost, so the method can not only conform to actual requirements, but also can have high practicality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-safety lamp tube, comprising:
a main body, and;
a circuit board, disposed in the main body, and comprising a circuit loop, a first heat generating element, a second heat generating element, wherein the second heat generating element is electrically connected to the circuit loop;
a thermal fuse, wherein the first heat generating element is electrically connected to the circuit loop via the thermal fuse, and the thermal fuse is adhered to the first heat generating element via an adhesive layer; and
a heat conducting material, disposed on the circuit board, wherein the heat conducting material covers the thermal fuse, the first heat generating element and the second heat generating element.

2. The high-safety lamp tube as claimed in claim 1, wherein the heat conducting material is a thermal grease.

3. The high-safety lamp tube as claimed in claim 1, wherein the first heat generating element and the second heat generating element are varistors, coils, transformers, cooper pins or control chips.

4. The high-safety lamp tube as claimed in claim 1, wherein the circuit board is a driving power source circuit board.

5. A method for increasing a protection range of a thermal fuse, comprising:
disposing the thermal fuse on a circuit board comprising a circuit loop, a first heat generating element and a second heat generating element, wherein the second heat generating element is electrically connected to the circuit loop;
electrically connecting the first heat generating element to the circuit loop via the thermal fuse, wherein the thermal fuse is attached to the first heat generating element via an adhesive layer; and
disposing a heat conducting material on the circuit board, and making the heat conducting material cover the thermal fuse, the first heat generating element and the second heat generating element.

6. The method for increasing the protection range of the thermal fuse as claimed in claim 5, further comprising:
pressing the heat conducting material to make a thickness of the heat conducting material to be uniform.

7. The method for increasing the protection range of the thermal fuse as claimed in claim 5, further comprising:
adhering the thermal fuse to the first heat generating element via an adhesive layer.

8. The method for increasing the protection range of the thermal fuse as claimed in claim 5, wherein the first heat generating element and the second heat generating element are varistors, coils, transformers, cooper pins or control chips.

* * * * *